US006984918B1

(12) United States Patent
Hachigo et al.

(10) Patent No.: US 6,984,918 B1
(45) Date of Patent: Jan. 10, 2006

(54) SAW DEVICE

(75) Inventors: Akihiro Hachigo, Itami (JP); Katsuhiro Itakura, Itami (JP); Satoshi Fujii, Itami (JP); Hideaki Nakahata, Itami (JP); Shinichi Shikata, Itami (JP)

(73) Assignee: Seiko Epson Corporation, Tokyo (JP)

( * ) Notice: Subject to any disclaimer, the term of this patent is extended or adjusted under 35 U.S.C. 154(b) by 586 days.

(21) Appl. No.: 10/089,804

(22) PCT Filed: Oct. 4, 2000

(86) PCT No.: PCT/JP00/06944

§ 371 (c)(1),
(2), (4) Date: Apr. 4, 2002

(87) PCT Pub. No.: WO01/28089

PCT Pub. Date: Apr. 19, 2001

(30) Foreign Application Priority Data

Oct. 15, 1999 (JP) ................................ 11-293631

(51) Int. Cl.
*H01L 41/04* (2006.01)
*H03H 9/145* (2006.01)

(52) U.S. Cl. ............................ 310/313 R; 310/313 A; 310/313 B

(58) Field of Classification Search ..... 310/313 A–313 D, 313 R
See application file for complete search history.

(56) References Cited

U.S. PATENT DOCUMENTS 5,160,869 A * 11/1992 Nakahata et al. ....... 310/313 A
5,440,188 A * 8/1995 Krempl et al. .......... 310/313 A
5,446,329 A 8/1995 Nakahata et al. ....... 310/313 A
5,581,141 A * 12/1996 Yamada et al. ......... 310/313 D
5,838,090 A * 11/1998 Nakahata et al. ....... 310/313 A
6,072,263 A * 6/2000 Toda ...................... 310/313 B
6,121,713 A * 9/2000 Inoue et al. ............ 310/313 A

FOREIGN PATENT DOCUMENTS

| | | |
|---|---|---|
| JP | 64-62911 | 3/1989 |
| JP | 3-198412 | 8/1991 |
| JP | 5-83078 | 4/1993 |
| JP | 9-51248 | 2/1997 |
| JP | 10-276061 | 10/1998 |

OTHER PUBLICATIONS

Yamanouchi, et al "*Saw Propagation Characteristics and Fabrication Technology of Piezoelectric Thin Film/Diamond Structure*" 1989, IEEE, UltraSonics Symposium, vol. 1, pp. 351-354.

(Continued)

*Primary Examiner*—Darren Schuberg
*Assistant Examiner*—J. Aguirrechea
(74) *Attorney, Agent, or Firm*—McDermott Will & Emery LLP

(57) ABSTRACT

The present invention provides a surface acoustic wave device comprising a diamond, having operating frequencies in the range of several hundreds of MHz to several tens of GHz, and being capable of operating at high frequencies.

The surface acoustic wave device of the present invention comprises a diamond layer or a substrate layer and a diamond layer, a ZnO piezoelectric layer, interdigital transducers and a short-circuit electrode layer, being characterized in that $(2\pi \cdot H/\lambda_M)$ is in the range of 3.0 to 10.0 where the thickness of the ZnO layer is H and the wavelength of the surface acoustic wave is $\lambda_M$.

11 Claims, 10 Drawing Sheets

OTHER PUBLICATIONS

Shikata, et al "*1.5GHz Saw Bandpass Filter Using Poly-Crystalline Diamond*" 1993, UltraSonics Symposium, pp. 277-280.

Nakahata, et al "*High Frequency Surface Acoustic Wave Filter Using ZnO/Diamond/Si Structure*" 1992, UltraSonics Symposium, pp. 377-380.

Nakahata, et al "*Saw Devices on Diamond*" 1995, IEEE UltraSonics Symposium, pp. 361-370.

Nakahata, et al "*High Frequency Surface Acoustic Wave Filter Using ZnO/Diamond/SI Structure*" Reprinted from Jpn. J. Appl. Phys. vol. 33, Part 1, No. 1A, Jan. 1994.

* cited by examiner

SAW DEVICE

TECHNICAL FIELD

The present invention relates to a surface acoustic wave device having operating frequencies in the range of several hundreds of MHz to several tens of GHz and, more particularly, to a surface acoustic wave device having excellent operation characteristics at high operating frequencies.

BACKGROUND ART

A surface acoustic wave device, which uses a surface acoustic wave being transmitted while energy is concentrated on the surface of a solid, is small, easy to produce and stable in temperature characteristics. Hence, the surface acoustic wave device is used as filters for TV receivers and the like. The surface acoustic wave device generally comprises interdigital transducers formed on the surface of a piezoelectric body. A typical surface acoustic wave device has a pair of interdigital transducers on the surface of the piezoelectric body to generate a surface acoustic wave. An alternating current applied to the input interdigital transducer is converted into mechanical energy on the surface of the piezoelectric body. However, since the electrode is comb-shaped, compression occurs in the piezoelectric body, and an acoustic wave generates. The acoustic wave is propagated through the surface of the piezoelectric body and reaches the output interdigital transducer. The surface acoustic wave having reached the output interdigital transducer is converted further into electrical energy by the output interdigital transducer and then output.

In recent years, the amount of information transmission has increased, and the range of transmission signals is expanding to the microwave range. The demand for devices capable of being used in the range of GHz is increasing. Generally, the operating frequency of a surface acoustic wave device depends on the propagation velocity and wavelength of a surface acoustic wave, and the wavelength is determined by the periodic length of the interdigital transducer. When electrodes having the same periodic length are used, in other words, when surface acoustic wave devices are used at the same wavelength, a surface acoustic wave device having a higher wave propagation velocity inside the material thereof can be used up to higher frequencies. Hence, a method has been proposed wherein a diamond having the highest velocity of sound among all substances (the velocity of the transverse wave: 13000 m/s, the velocity of the longitudinal wave: 16000 m/s) is used as a substrate (for example, Japanese Unexamined Patent Publication No. 64-62911).

Generally, a surface acoustic wave device having a larger electromechanical coupling coefficient (an index of conversion efficiency when electric energy is converted into mechanical energy) operates at higher efficiency. In particular, it is preferable that the electromechanical coupling coefficient is not less than 0.5%. Furthermore, when using the device at high operating frequencies, the propagation velocity of the wave is required to be high.

In a surface acoustic wave device having a structure wherein a ZnO layer is stacked as a piezoelectric body on a diamond layer, it is possible to obtain a device that generates a surface acoustic wave having a high propagation velocity and that has a large electromechanical coupling coefficient by limiting the thickness of the ZnO layer in a specific range (for example, Japanese Unexamined Patent Publication No. 9-51248, Japanese Unexamined Patent Publication No. 10-276061, etc.).

In the case where a piezoelectric thin film formed on a substrate is used, the propagation velocity and electromechanical coupling coefficient depend not only on the material of the piezoelectric thin film and the substrate but also on the thickness of the piezoelectric thin film. Furthermore, when the thin film is used, the quality of the film affects the operation characteristics of the surface acoustic wave device and is required to be excellent in order to attain a high propagation velocity, a high electromechanical coupling coefficient and a low propagation loss. However, in the surface acoustic wave devices disclosed in the above-mentioned Japanese Unexamined Patent Publication No. 9-51248, Japanese Unexamined Patent Publication No. 10-276061, etc., since the thickness of the ZnO layer is relatively small, the quality of the film deteriorates, whereby the propagation loss increases and the electromechanical coupling coefficient becomes smaller than its theoretical value. As a result, proper surface acoustic wave devices are not obtained.

In view of the above-mentioned situations, the present invention is intended to provide a surface acoustic wave device comprising a diamond and having a structure wherein a ZnO layer is formed on the diamond, having operating frequencies in the range of several hundreds of MHz to several tens of GHz, and being capable of selectively using high operating frequencies.

DISCLOSURE OF INVENTION

The present invention attains a surface acoustic wave device comprising a diamond substrate or a diamond layer formed on a subsrate, a ZnO piezoelectric thin film layer, an interdigital transducer layer and a short-circuit electrode layer, wherein the range of the thickness of the ZnO film is determined depending on the wavelength of a surface acoustic wave, and the mode of the surface acoustic wave is specified simultaneously, whereby the surface acoustic wave device has a large surface acoustic wave propagation velocity ($V \geqq 5500$ m/s) and a large electromechanical coupling coefficient ($K^2 \geqq 0.5\%$), and in particular, the surface acoustic wave device has small propagation loss and operates at high frequencies.

Surface acoustic wave devices obtained in ten different conditions and structures will be described here. Hereinafter, the thickness of the ZnO film is designated by H and represented by ($2\pi \cdot H/\lambda_M$), that is, the thickness divided by the wavelength $\lambda_M$ of a surface acoustic wave to be propagated and multiplied by $2\pi$. In a similar way, the thickness of either the diamond substrate or the diamond layer is designated by HD and represented by ($2\pi \cdot HD/\lambda_M$), that is, the thickness divided by the wavelength and multiplied by $2\pi$. These are dimensionless parameters.

According to experiments by the inventors of the present invention, it is known that the ratios of the thicknesses H and HID to the wavelength have an effect on the propagation velocity V and the electromechanical coupling coefficient $K^2$. Hence, it is useful to classify the conditions according to the above-mentioned parameters. FIGS. 1 through 4 are sectional views of the surface acoustic wave devices of the present invention. These are referred to as Types I, II, III and IV for the sake of simplicity.

BEST MODE FOR CARRYING OUT THE INVENTION

Figure 1:
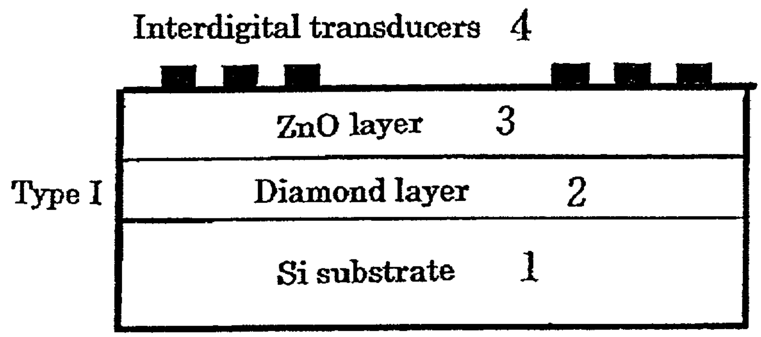
FIG. 1 is a cross-sectional view showing an example of the Type I surface acoustic wave device of the present invention.

FIG. 1 is a view showing the Type I surface acoustic wave device. In this device, a diamond layer 2 is formed on a Si substrate 1, a ZnO layer 3 is provided on the diamond layer 2, and interdigital transducers 4 are formed on the ZnO layer 3. This device corresponds to Types (2) to (4) described later.

Figure 2:
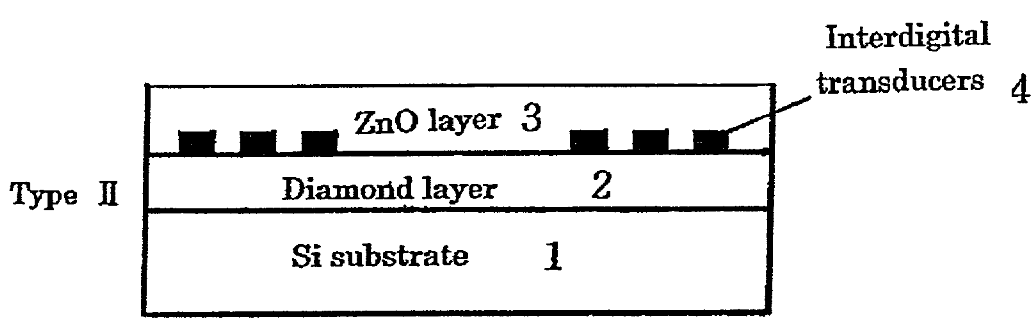
FIG. 2 is a cross-sectional view showing an example of the Type II surface acoustic wave device of the present invention.

FIG. 2 is a view showing the Type II surface acoustic wave device. In this device, a diamond layer 2 is formed on a Si substrate 1, and interdigital transducers 4 are formed on the diamond layer 2. Furthermore, a ZnO layer 3 is formed on the interdigital transducers 4. This device corresponds to Type (5) described later.

Figure 3:
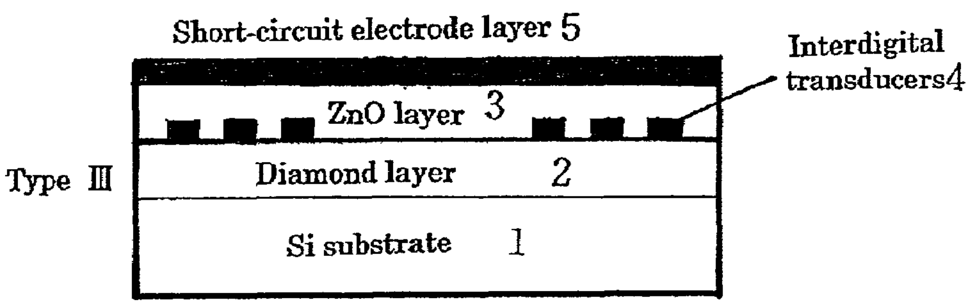
FIG. 3 is a cross-sectional view showing an example of the Type III surface acoustic wave device of the present invention.

FIG. 3 is a view showing the Type III surface acoustic wave device. In this device, a diamond layer 2 is formed on a Si substrate 1, interdigital transducers 4 are formed on the diamond layer 2, and a ZnO layer 3 is formed on the interdigital transducers 4. The structure obtained up to this stage is the same as that of the Type II surface acoustic wave device. Furthermore, a short-circuit electrode layer 5 is formed on the ZnO layer 3. This device corresponds to Types (6) and (7) described later.

Figure 4:
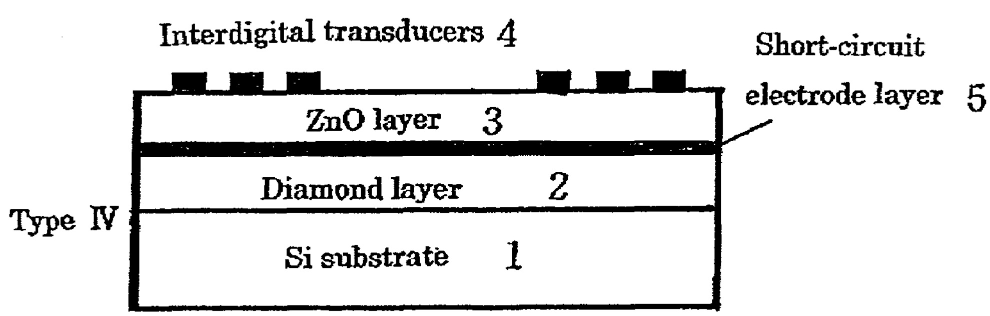
FIG. 4 is a cross-sectional view showing an example of the Type IV surface acoustic wave device of the present invention.

FIG. 4 is a view showing the Type IV surface acoustic wave device. In this device, a diamond layer 2 is formed on a Si substrate 1, a short-circuit electrode layer 5 is formed on the diamond layer 2, a ZnO layer 3 is formed on the short-circuit electrode layer 5, and interdigital transducers 4 are formed on the ZnO layer 3. This device corresponds to Types (8) to (10) described later. Types (2) to (10) will be described later by referring to experimental results. The wavelength of the surface acoustic wave is $\lambda_M$.

Figure 5:
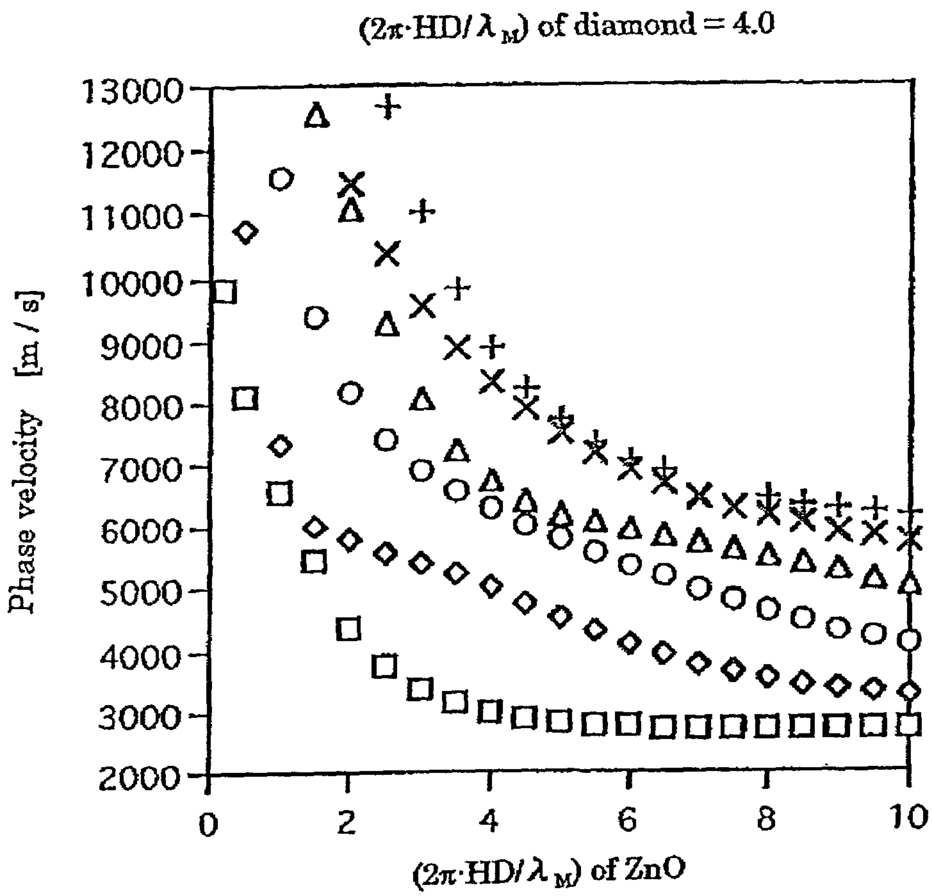
FIG. 5 is a graph showing the relationship between the thickness of the ZnO and the phase velocity V of a surface acoustic wave in the case where the thickness of the diamond layer is ($2\pi \cdot HD/\lambda_M$)=4.0 in an embodiment of the present invention; the values indicated by squares represent a zeroth order mode, the values indicated by lozenges represent a first order mode, the values indicated by circles represent a second order mode, the values indicated by triangles represent a third order mode, the values indicated by x marks represent a fourth order mode, and the values indicated by + marks represent a fifth order mode; the above-mentioned relationships between the marks and the orders of the modes are the same as those shown in FIGS. 6 through 9.

FIG. 5 is a graph showing the result of the measurement of phase velocity (propagation velocity) depending on the thickness H of the ZnO layer in the case where the thickness HD of the diamond layer is $2\pi \cdot HD/\lambda_M$=4.0. The abscissa represents $2\pi \cdot H/\lambda_M$, and the ordinate represents phase velocity (m/s). According to this result, as the ZnO layer is thinner, the ZnO layer is more susceptible to the effect of the diamond having a high velocity of sound, and the phase velocity becomes higher. The values indicated by squares represent a zeroth order mode, the values indicated by lozenges represent a first order mode, the values indicated by circles represent a second order mode, the values indicated by triangles represent a third order mode, the values indicated by x marks represent a fourth order mode, and the values indicated by + marks represent a fifth order mode. The phase velocity does not change depending on the difference in the structure (the difference in Types I, II, III and IV).

Figure 6:
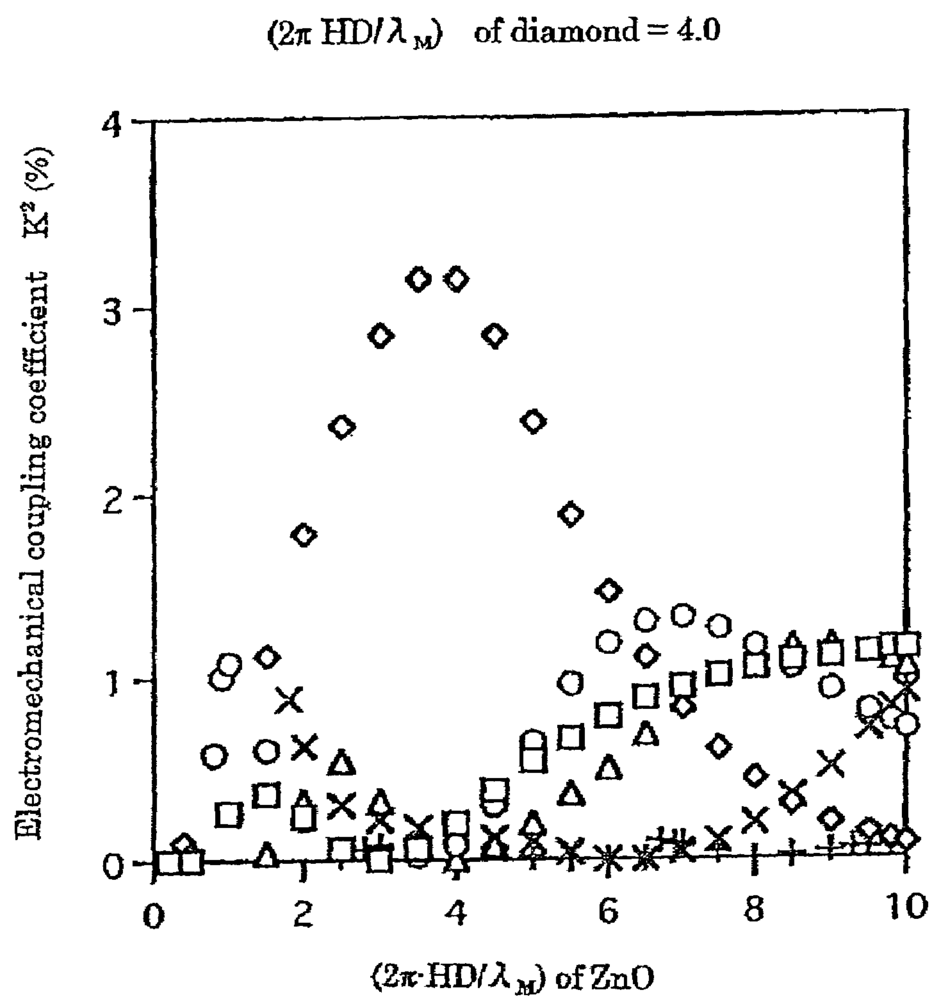
FIG. 6 is a graph showing the relationship between the thickness of the ZnO layer and the electromechanical coupling coefficient $K^2$ in each mode in the case where the thickness of the diamond layer is ($2\pi \cdot HD/\lambda_M$)=4.0 in Type I surface acoustic wave device in accordance with the embodiment of the present invention.

FIG. 6 is a graph showing the result of the measurement of the electromechanical coupling coefficient $K^2$ in the structure of Type I. When the ZnO layer is thin, the electromechanical coupling coefficient in the second order mode is large. When the ZnO layer becomes thicker, the electromechanical coupling coefficient in the first order mode becomes large. When the ZnO layer becomes further thicker, the electromechanical coupling coefficients in the zeroth, second and fourth order modes become large.

Figure 7:
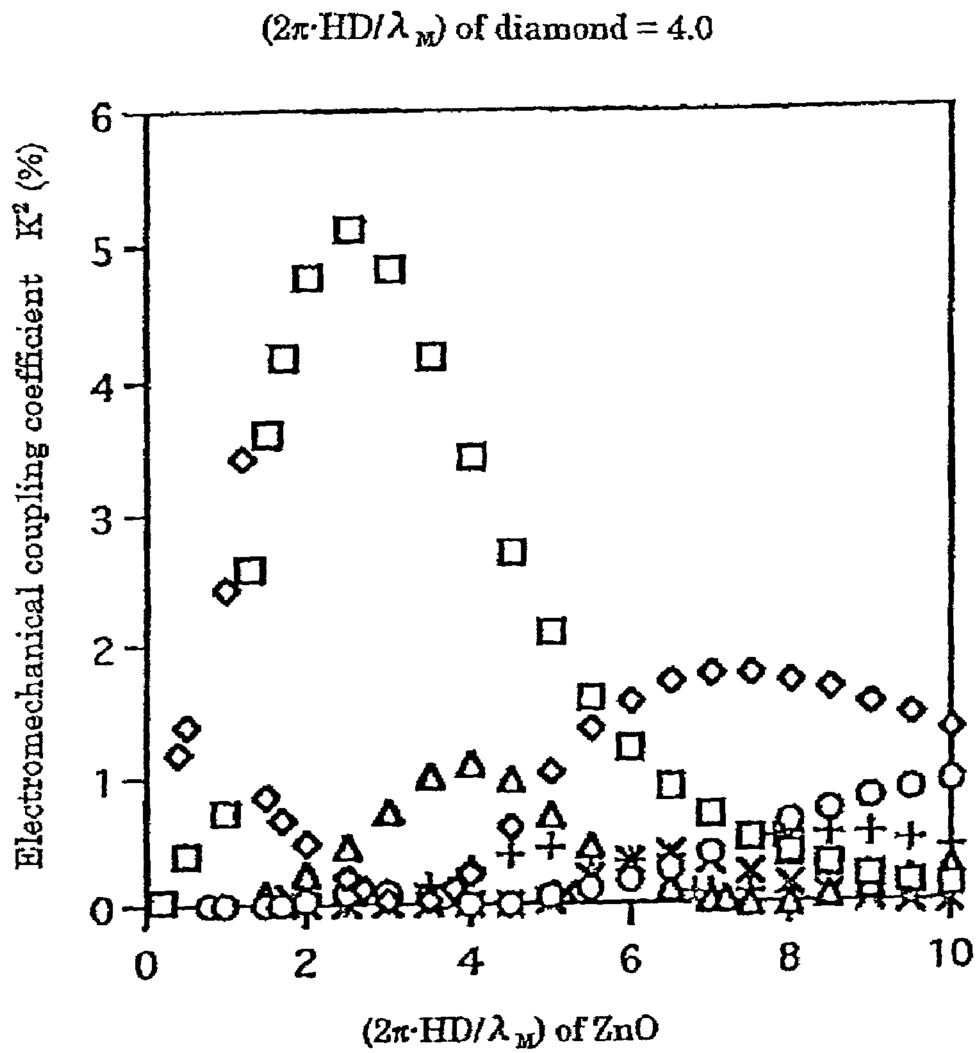
FIG. 7 is a graph showing the relationship between the thickness of the ZnO layer and the electromechanical coupling coefficient $K^2$ in each mode in the case where the thickness of the diamond layer is ($2\pi \cdot HD/\lambda_M$)=4.0 in Type II surface acoustic wave device in accordance with the embodiment of the present invention.

FIG. 7 is a graph showing the result of the measurement of the electromechanical coupling coefficient $K^2$ in the structure of Type II. When the ZnO layer is thin, the electromechanical coupling coefficient in the first order mode is large. When the ZnO layer becomes thicker, the electromechanical coupling coefficients in the zeroth and third order modes become large. When the ZnO layer becomes further thicker, the electromechanical coupling coefficients in the first, second and fifth order modes become large.

Figure 8:
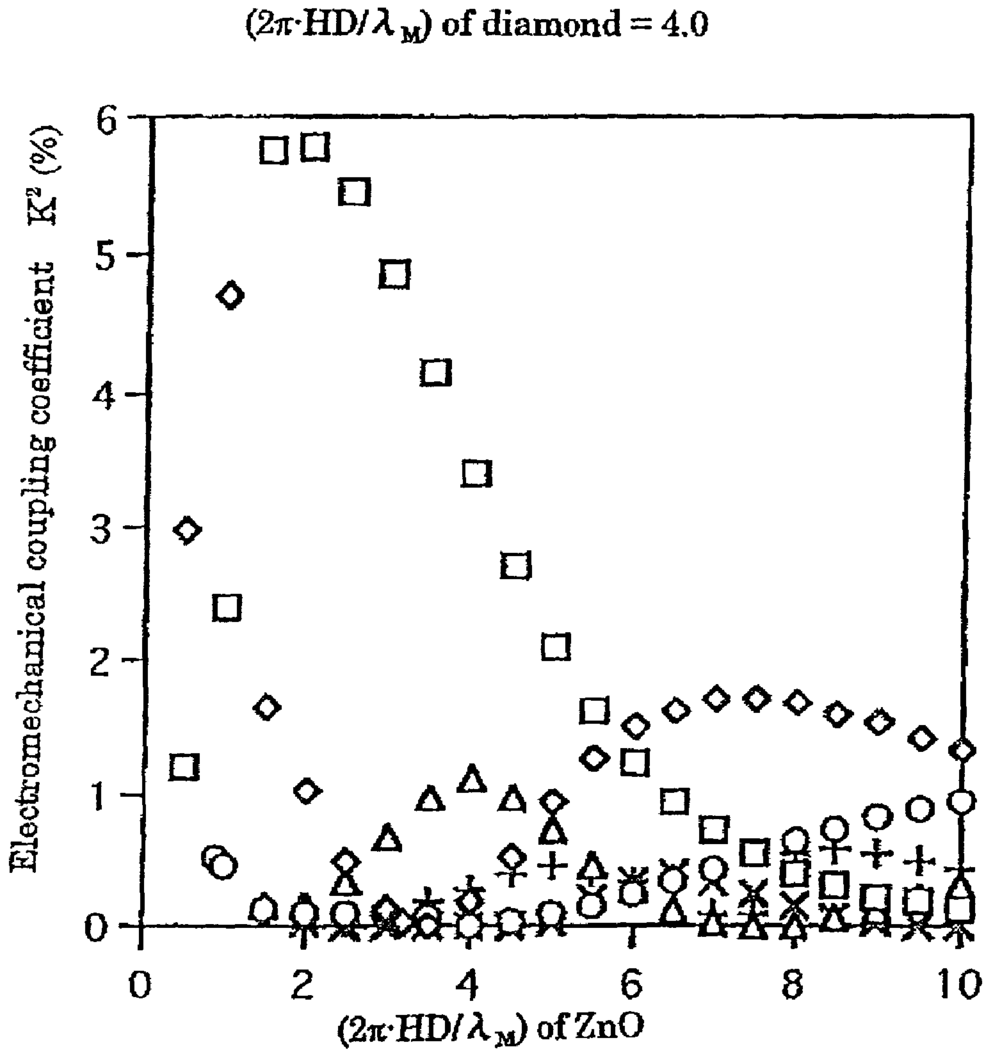
FIG. 8 is a graph showing the relationship between the thickness of the ZnO layer and the electromechanical coupling coefficient $K^2$ in each mode in the case where the thickness of the diamond layer is ($2\pi \cdot HD/\lambda_M$)=4.0 in the Type III surface acoustic wave device in accordance with the embodiment of the present invention.

FIG. 8 is a graph showing the result of the measurement of the electromechanical coupling coefficient $K^2$ in the structure of Type III. When the ZnO layer is thin, the electromechanical coupling coefficients in the zeroth and first order modes are large. When the ZnO layer becomes thicker, the electromechanical coupling coefficient in the third order mode becomes large. When the ZnO layer becomes further thicker, the electromechanical coupling coefficients in the first, second and fifth order modes become large.

Figure 9:
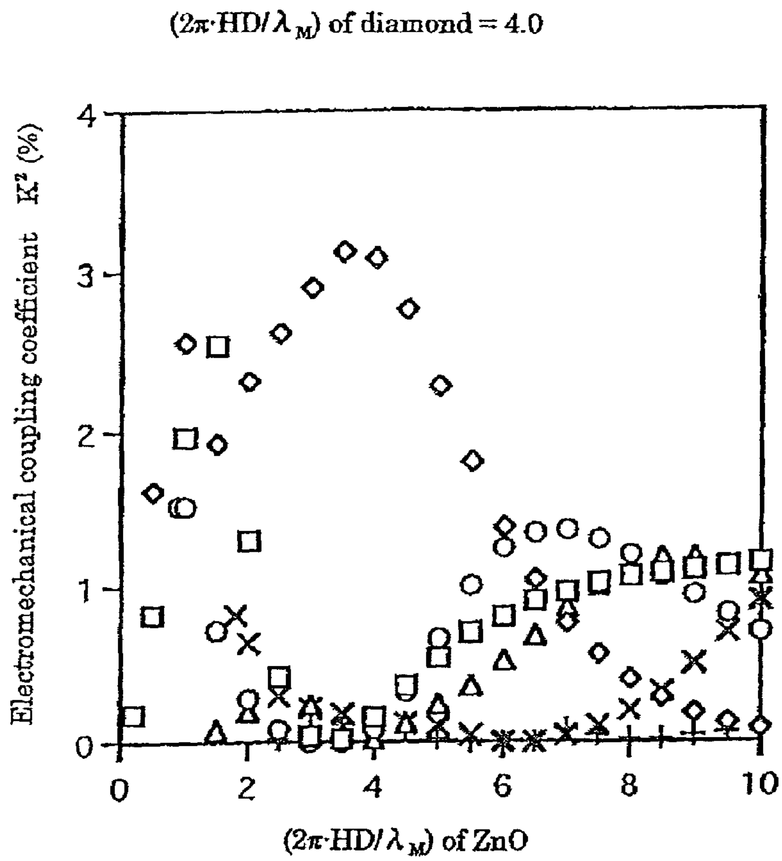
FIG. 9 is a graph showing the relationship between the thickness of the ZnO layer and the electromechanical coupling coefficient $K^2$ in each mode in the case where the thickness of the diamond layer is ($2\pi \cdot HD/\lambda_M$)=4.0 in the Type IV surface acoustic wave device in accordance with the embodiment of the present invention.

FIG. 9 is a graph showing the result of the measurement of the electromechanical coupling coefficient $K^2$ in the structure of Type IV. When the ZnO layer is thin, the electromechanical coupling coefficients in the zeroth and first order modes are large. When the ZnO layer becomes thicker, the electromechanical coupling coefficient in the first order mode becomes large. When the ZnO layer becomes further thicker, the electromechanical coupling coefficients in the zeroth, second, third and fourth order modes become large.

Figure 10:
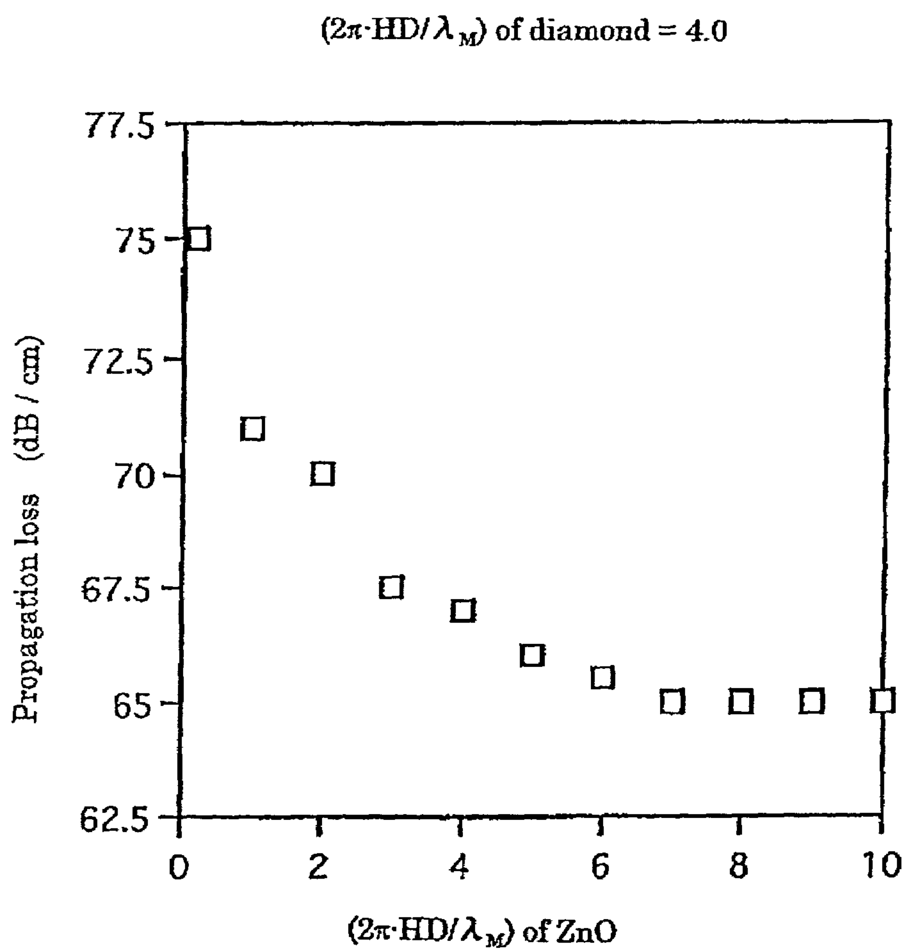
FIG. 10 is a graph showing the relationship between the thickness of the ZnO layer and a propagation loss in the case where the thickness of the diamond layer is ($2\pi \cdot HD/\lambda_M$)=4.0 in Type I surface acoustic wave device in accordance with the embodiment of the present invention.

FIG. 10 is a graph showing the result of the measurement of a propagation loss in the structure of Type I. The propagation loss is plotted for the first order mode wherein the electromechanical coupling coefficient is large. As a result, the thicker the ZnO layer, the smaller the propagation loss.

Figure 12:
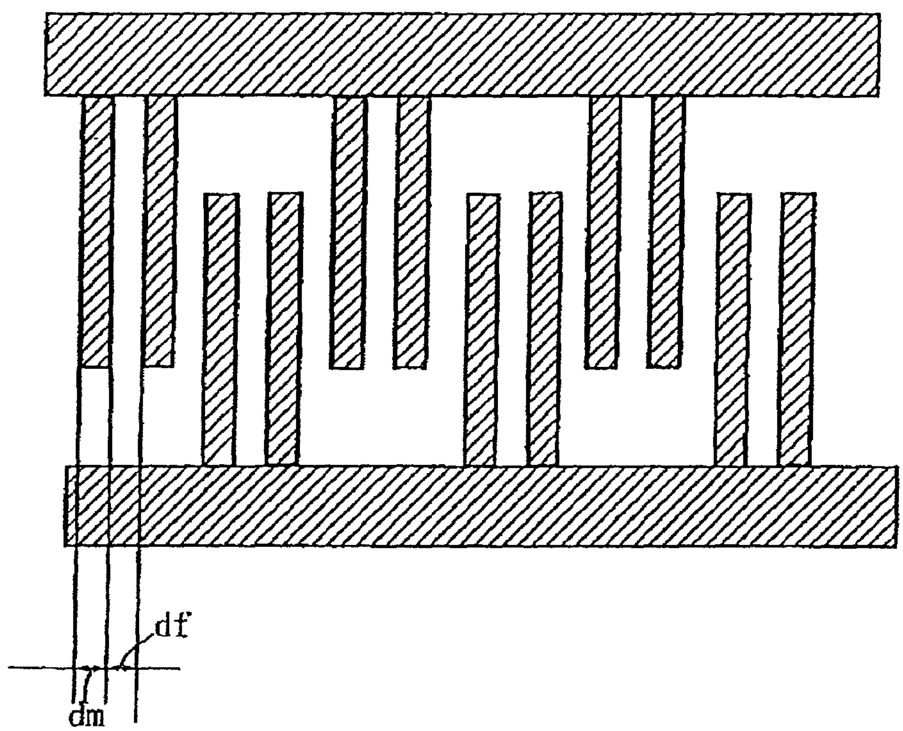
FIG. 12 is a plan view showing double interdigital transducers used for another embodiment of the present invention.

Double electrodes were used as interdigital transducers to measure the propagation loss. The double interdigital transducers are structured as described in FIG. 12 so that two electrode segments having a width of dm are arranged with a clearance of df therebetween whereby the two electrode segments are formed repeatedly at intervals of 2·(df+dim). When the electrodes are used to excite a surface acoustic wave, the electrodes can reduce the effect of scattering owing to the mismatch between the substance of the electrode section and the substance of the piezoelectric section.

[Explanation of Types 2 to 10]

Type I . . . Types 2, 3 and 4

(Type 2) The surface acoustic wave device of this type has a structure wherein a ZnO layer is stacked on a dielectric thin film comprising a diamond layer or a diamond layer formed on a substrate, and interdigital transducers for exciting a surface acoustic wave are disposed on the ZnO layer. This type is characterized by the use of a second order mode surface acoustic wave excited by a structure wherein the value of $2\pi \cdot H/\lambda_M$ satisfies $(2\pi \cdot H/\lambda_M)$=5.0 to 6.0 when the thickness of the ZnO layer is H and the wavelength of the surface acoustic wave is $\lambda_M$.

The smaller the value of $(2\pi \cdot H/\lambda_M)$, the larger the phase velocity V. This is desirable with respect to the phase velocity. However, when $(2\pi \cdot H/\lambda_M)$ is less than 4.2, the electromechanical coupling coefficient becomes small, that is 0.5% or less. Furthermore, when $(2\pi \cdot H/\lambda_M)$ is more than 6.0, the propagation velocity is 5500 m/s or less. This propagation velocity is a value attainable by conventional materials.

(Type 3) The surface acoustic wave device of this type has a structure wherein a ZnO layer is stacked on a dielectric thin film comprising a diamond layer or a diamond layer formed on a substrate, and interdigital transducers for exciting a surface acoustic wave are disposed on the ZnO layer. This type is characterized by the use of a third order mode surface acoustic wave excited by a structure wherein the value of $2\pi \cdot H/\lambda_M$ satisfies $(2\pi \cdot H/\lambda_M)$=6.0 to 8.5 when the thickness of the ZnO layer is H and the wavelength of the surface acoustic wave is $\lambda_M$.

The smaller the value of $(2\pi \cdot H/\lambda_M)$, the larger the phase velocity V. This is desirable with respect to the phase velocity. However, when $(2\pi \cdot H/\lambda_M)$ is less than 6.0, the electromechanical coupling coefficient becomes small, that is 0.5% or less. Furthermore, when $(2\pi \cdot H/\lambda_M)$ is more than 8.5, the propagation velocity is 5500 m/s or less. This propagation velocity is a value attainable even by conventional materials.

(Type 4) The surface acoustic wave device of this type has a structure wherein a ZnO layer is stacked on a dielectric thin film comprising a diamond layer or a diamond layer formed on a substrate, and interdigital transducers for exciting a surface acoustic wave is disposed on the ZnO layer. This type is characterized by the use of a fourth order mode surface acoustic wave excited by a structure wherein the value of $2\pi \cdot H/\lambda_M$ satisfies $(2\pi \cdot H/\lambda_M)$=9.0 to 10.0 when the thickness of the ZnO layer is H and the wavelength of the surface acoustic wave is $\lambda_M$.

The smaller the value of $(2\pi \cdot H/\lambda_M)$, the larger the phase velocity V. This is desirable with respect to the phase velocity. However, when $(2\pi \cdot H/\lambda_M)$ is less than 9.0, the electromechanical coupling coefficient becomes small, that is 0.5% or less.

Type II . . . Type 5

(Type 5) The surface acoustic wave device of this type has a structure wherein interdigital transducers for exciting a surface acoustic wave are disposed on a dielectric thin film comprising a diamond layer or a diamond layer formed on a substrate, and a ZnO layer is stacked on the interdigital transducers. This type is characterized by the use of a fifth order mode surface acoustic wave excited by a structure wherein the value of $2\pi \cdot H/\lambda_M$ satisfies $(2\pi \cdot H/\lambda_M)$=7.7 to 9.5 when the thickness of the ZnO layer is H and the wavelength of the surface acoustic wave is $\lambda_M$.

The smaller the value of $(2\pi \cdot H/\lambda_M)$, the larger the phase velocity V. This is desirable with respect to the phase velocity. However, when $(2\pi \cdot H/\lambda_M)$ is less than 7.7, the electromechanical coupling coefficient becomes small, that is 0.5% or less. Furthermore, when $(2\pi \cdot H/\lambda_M)$ is more than 9.5, the electromechanical coupling coefficient becomes small, that is 0.5% or less.

Type III . . . Types 6, 7

(Type 6) The surface acoustic wave device of this type has a structure wherein interdigital transducers for exciting a surface acoustic wave are disposed on a dielectric thin film comprising a diamond layer or a diamond layer formed on a substrate, a ZnO layer is stacked on the interdigital transducers, and a short-circuit electrode is disposed on the ZnO layer. This type is characterized by the use of the second order mode surface acoustic wave excited by a structure wherein the value of $2\pi \cdot H/\lambda_M$ satisfies $(2\pi \cdot H/\lambda_M)$ =7.2 to 8.5 when the thickness of the ZnO layer is H and the wavelength of the surface acoustic wave is $\lambda_M$.

The smaller the value of $(2\pi \cdot H/\lambda_M$, the larger the phase velocity V. This is desirable with respect to the phase velocity. However, when $(2\pi \cdot H/\lambda_M)$ is less than 7.2, the electromechanical coupling coefficient becomes small, that is 0.5% or less. Furthermore, when $(2\pi \cdot H/\lambda_M)$ is more than 8.5, the propagation velocity is 5500 m/s or less. This propagation velocity is a value attainable even by conventional materials.

(Type 7) The surface acoustic wave device of this type has a structure wherein interdigital transducers for exciting a surface acoustic wave are disposed on a dielectric thin film comprising a diamond layer or a diamond layer formed on a substrate, a ZnO layer is stacked on the interdigital transducers, and a short-circuit electrode is disposed on the ZnO layer. This type is characterized by the use of the fifth order mode surface acoustic wave excited by a structure wherein the value of $2\pi\cdot H/\lambda_M$ satisfies $(2\pi\cdot H/\lambda_M)$=7.8 to 9.5 when the thickness of the ZnO layer is H and the wavelength of the surface acoustic wave is $\lambda_M$.

The smaller the value of $(2\pi\cdot H/\lambda_M)$, the larger the phase velocity V. This is desirable with respect to the phase velocity. However, when $(2\pi\cdot H/\lambda_M)$ is less than 7.8, the electromechanical coupling coefficient becomes small, that is 0.5% or less. Furthermore, when $(2\pi\cdot H/\lambda_M)$ is more than 9.5, the electromechanical coupling coefficient becomes small, that is 0.5% or less.

Type IV . . . Types 8, 9, 10

(Type 8) The surface acoustic wave device of this type has a structure wherein a short-circuit electrode is stacked on a dielectric thin film comprising a diamond layer or a diamond layer formed on a substrate, a ZnO layer is stacked on the short-circuit electrode, and interdigital transducers for exciting a surface acoustic wave are disposed on the ZnO layer. This type is characterized by the use of the second order mode surface acoustic wave excited by a structure wherein the value of $2\pi\cdot H/\lambda_M$ satisfies $(2\pi\cdot H/\lambda_M)$=4.8 to 6.0 when the thickness of the ZnO layer is H and the wavelength of the surface acoustic wave is $\lambda_M$.

The smaller the value of $(2\pi\cdot H/\lambda_M)$, the larger the phase velocity V. This is desirable with respect to the phase velocity. However, when $(2\pi\cdot H/\lambda_M)$ is less than 4.8, the electromechanical coupling coefficient becomes small, that is 0.5% or less. Furthermore, when $(2\pi\cdot H/\lambda_M)$ is more than 6.0, the propagation velocity is 5500 m/s or less. This propagation velocity is a value attainable even by conventional materials.

(Type 9) The surface acoustic wave device of this type has a structure wherein a short-circuit electrode is stacked on a dielectric thin film comprising a diamond layer or a diamond layer formed on a substrate, a ZnO layer is stacked on the short-circuit electrode, and interdigital transducers for exciting a surface acoustic wave are disposed on the ZnO layer. This type is characterized by the use of the third order mode surface acoustic wave excited by a structure wherein the value of $2\pi\cdot H/\lambda_M$ satisfies $(2\pi\cdot H/\lambda_M)$=6.0 to 8.5 when the thickness of the ZnO layer is H and the wavelength of the surface acoustic wave is $\lambda_M$.

The smaller the value of $(2\pi\cdot H/\lambda_M)$, the larger the phase velocity V. This is desirable with respect to the phase velocity. However, when $(2\pi\cdot H/\lambda_M)$ is less than 6.0, the electromechanical coupling coefficient becomes small, that is 0.5% or less. Furthermore, when $(2\pi\cdot H/\lambda_M)$ is more than 8.5, the propagation velocity is 5500 m/s or less. This propagation velocity is a value attainable even by conventional materials.

(Type 10) The surface acoustic wave device of this type has a structure wherein a short-circuit electrode is stacked on a dielectric thin film comprising a diamond layer or a diamond layer formed on a substrate, a ZnO layer is stacked on the short-circuit electrode, and interdigital transducers for exciting a surface acoustic wave are disposed on the ZnO layer. This type is characterized by the use of the fourth order mode surface acoustic wave excited by a structure wherein the value of $2\pi\cdot H/\lambda_M$ satisfies $(2\pi\cdot H/\lambda_M)$=9.0 to 10.0 when the thickness of the ZnO layer is H and the wavelength of the surface acoustic wave is $\lambda_M$.

The smaller the value of $(2\pi\cdot H/\lambda_M)$, the larger the phase velocity V. This is desirable with respect to the phase velocity. However, when $(2\pi\cdot H/\lambda_M)$ is less than 9.0, the electromechanical coupling coefficient becomes small, that is 0.5% or less.

Figure 11:
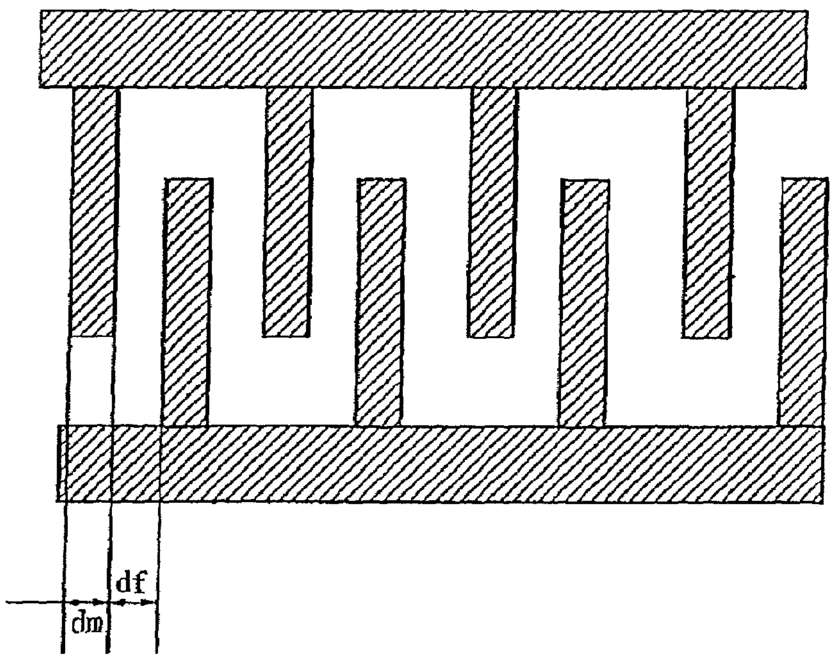
FIG. 11 is a plan view showing interdigital transducers used for the embodiment of the present invention.

The surface acoustic wave used for the devices of Type 1 to Type 10 may be a fundamental wave or a harmonic wave. The fundamental wave described herein has a wavelength of $\lambda=2\cdot(df+dm)$ wherein $\lambda$ is the wavelength of a generated surface acoustic wave, the width of each electrode segment of the interdigital transducer shown in FIG. 11 is dm and the clearance between the electrode segments is df. The harmonic wave has a wavelength equal to a value obtained by dividing the wavelength of the fundamental wave by an integral multiple, i.e., $\lambda_M=\lambda/M$ when a multiple of the harmonic wave is M.

Embodiments

In the present invention, both a natural diamond and a synthetic diamond can be used. A monocrystalline diamond, a polycrystalline diamond and an amorphous diamond can also be used. The diamond may be used as a single piece or a thin film formed on a substrate made of a different material.

The diamond layer may be a part of the substrate or the whole of the substrate. The whole of the diamond layer may be insulating, and a part or the whole thereof may be semi-conducting. The substrate on which a diamond film is formed may be made of an inorganic material or a metal, such as Si, Mo or W, or glass, ceramics, oxide or nitride. The optimal value of $(2\pi\cdot H/\lambda_M)$ is the same for any substrate material. However, when the diamond film is very thin and its thickness is much smaller than the wavelength of a surface acoustic wave, in particular when $2\pi\cdot H/\lambda_M<0.5$, an effect occurs depending on the substrate material. Hence, it is preferable that the value of $2\pi\cdot H/\lambda_M$ is 0.5 or more. It is further preferable that the value of $2\pi\cdot H/\lambda_M$ is 4.0 or more.

The thin film of a diamond can be formed by known methods, such as the CVD method, plasma CVD method, PVD method and thermal filament method. As methods of converting the gas inside a reaction chamber into plasma, various discharge methods, such as the high-frequency/low-frequency glow discharge method and arc discharge method, can be used. A diamond film can be formed by using a compound including hydrogen atoms. Furthermore, a diamond film can be formed by using a gas capable of supplying halogen atoms and a compound including hydrogen atoms. The gas capable of supplying halogen atoms includes all of the compounds including halogen molecules as a matter of course, and compounds including halogen atoms in molecules thereof, such as halogenated organic compounds and halogenated inorganic compounds. These compounds are, for example, paraffin, olefin, alicyclic and aromatic organic compounds, such as methane fluoride, ethane fluoride, methane trifluoride and ethylene fluoride, and inorganic compounds, such as silane halide. The temperature of the substrate can be lowered by introducing a halogen gas into a film-forming chamber. A diamond film can be formed at 200° C. to 900° C.

It is preferable that the halogen gas have a large force of bonding with hydrogen and have a small atomic radius. In particular, when forming a stable film under a low pressure, fluoride compounds are preferably used. Furthermore, compounds including hydrogen atoms are aliphatic hydrocarbons, such as methane, ethane and propane, aromatic hydrocarbons, such as benzene and naphthalene, unsaturated hydrocarbons such as ethylene and propylene, and organic compounds having hetero atoms such as hydrazine.

A high-purity diamond is an insulator having a low dielectric constant. However, a semi-conducting diamond can be formed by introducing impurities, such as B, Al, P and S, or by introducing lattice defects by ion implantation or electron beam irradiation. The single crystal of a semi-conducting diamond including B is rarely yielded as natural diamond and can be produced artificially by the ultra-high pressure method. It is preferable that the diamond layer or the diamond film formed on the substrate be an insulator and have a resistivity of $10^7$ Ωcm or more, preferably $10^9$ Ωcm or more. Furthermore, it is preferable that the surface of the diamond layer or the thin film of a diamond be flat to reduce scattering of the surface acoustic wave or other losses. The surface is required to be ground as necessary.

In addition, it is also possible to use the thin film of a single-crystal diamond formed by the epitaxial method. The thin film of ZnO can be grown by the sputtering method or the CVD method so as to have high piezoelectric performance and so as to be excellent in the c-axis orientation property. It is preferable that the c-axis orientation of the thin film is 3° or less in terms of the a value and that the resistivity thereof is $10^5$ Ωcm or more.

It is desirable that the ZnO film have the c-axis orientation property. The c-axis orientation is defined herein that the (001) face of the ZnO film is parallel with the substrate. When the formed ZnO film is c-axis oriented, it is possible to attain a surface acoustic wave device wherein the piezoelectric performance originally provided in the ZnO film is fully used.

As materials of the interdigital transducers and the short-circuit electrode, it is possible to use metals that have low resistivity values and can be formed into electrodes by etching, for example, metals that can be subjected to vapor deposition at low temperatures, such as Au, Al and Cu, metals that can be formed into films at high temperatures, such as Ti, Mo and W, or a combination of two or more kinds of metals, such as Al vapor-deposited on Ti. For ease of electrode production, it is preferable to use Al or Ti. The interdigital transducer can be formed as described below. After a metal film for the electrode is formed, a resist is applied uniformly to the surface of the metal film for the electrode. A mask formed of a transparent flat plate made from glass or the like having an interdigital transducer pattern is placed on the surface of a metal that has been applied with a resist, and the resist is exposed to light by light irradiation using a mercury lamp or the like. Or, without using a mask, the resist may be directly exposed to electron beams. After this, development is carried out to form a interdigital transducer in accordance with the resist pattern.

Although the thicknesses of the interdigital transducers and the short-circuit electrode are not particularly restricted, the thicknesses preferably should be about 10 to 500 nm. When the thicknesses are less than 10 nm, the resistivity values become high and the losses increase. On the other hand, when the thicknesses are more than 500 nm, a mass addition effect causes a significant reflection of the surface acoustic wave.

As a method of etching the electrodes, the wet etching method by using an alkaline solution, such as a sodium hydroxide solution, or by using an acidic solution, such as nitric acid, can be used for low-melting-point metals, such as Al. High-melting-point metals can also be etched by using a mixed solution of hydrofluoric acid and nitric acid. Furthermore, the electrodes can also be produced by the reactive ion etching method by using $BCl_3$ gas or the like.

The chemical agents or gases used during electrode etching may degrade the surface of ZnO. To prevent this, it is possible to insert a thin insulator or a dielectric substance between the ZnO film and the interdigital transducers. In this case, the thickness of the thin film is required to be 50 nm or less to prevent the effect of the thin film.

Embodiment 1

The four kinds of surface acoustic wave filters shown in FIGS. 1 through 4 were produced while the thickness of the ZnO film was changed. The characteristics of the filters were measured, and the phase velocity $V=f\cdot\lambda_M$ of a surface acoustic wave was obtained from the operating frequency f of each filter. The radiant impedance of the interdigital transducers was measured, and the electromechanical coupling coefficient $K^2$ was obtained.

After a diamond film having a thickness of 50 μm was formed on a Si substrate having dimensions of 10 mm×10 mm×0.3 mm by the microwave plasma CVD method, the surface of the diamond was polished to have various thicknesses of 1 to 30 μm by using a diamond coat grinder. A gas obtained by diluting $CH_4$ with $H_2$ 100 times was used as the material of the diamond. Each of these films had a resistivity of $10^9$ Ωcm or more.

A piezoelectric body, interdigital transducers or a short-circuit electrode was formed on the polished surface of the diamond. A thin film of ZnO was formed as a piezoelectric body. The thin film of ZnO was obtained by sputtering polycrystalline ZnO by using the mixed gas of Ar and oxygen. The conditions of the sputtering are as follows: a substrate temperature of 400° C., an RF power of 160 W and a pressure of 2.7 Pa. The thickness of the ZnO film can be changed by changing the sputtering time. The ZnO films having thicknesses ($2\pi\cdot H/\lambda_M$) in the range of 0.2 to 10 were formed.

The interdigital transducers and the short-circuit electrode were vapor-deposited so as to have a thickness of 50 nm by the resistance heating method, and the electrodes were produced by the photolithography method. The wet etching method was used to produce the electrodes. The width of each electrode segment and the clearance between the electrode segments were 0.5 μm to 4 μm. A fundamental wave was formed in accordance with the electrode pattern shown in FIG. 11 so as to have a wavelength $\lambda_M$ of 2 to 16 μm. A harmonic wave was formed in accordance with the electrode pattern shown in FIG. 12 so as to be a third harmonic wave having a wavelength $\lambda_M$ of 1.33 to 10.67 μm.

FIG. 5 is a graph showing a phase velocity depending on the thickness ($2\pi\cdot H/\lambda_M$) of the ZnO film. FIG. 6 is a graph showing a result of the measurement of the electromechanical coupling coefficient obtained by the structure shown in FIG. 1 depending on the thickness ($2\pi\cdot H/\lambda_M$) of the ZnO film. FIG. 7 is a graph showing a result of the measurement of the electromechanical coupling coefficient obtained by the structure shown in FIG. 2 depending on the thickness ($2\pi\cdot H/\lambda_M$) of the ZnO film. FIG. 8 is a graph showing a result of the measurement of the electromechanical coupling coefficient obtained by the structure shown in FIG. 3 depending on the thickness ($2\pi\cdot H/\lambda_M$) of the ZnO film. Furthermore, FIG. 9 is a graph showing a result of the measurement of the electromechanical coupling coefficient obtained by the structure shown in FIG. 4 depending on the thickness ($2\pi\cdot H/\lambda_M$) of the ZnO film. According to the figures, the structures selected depending on the thickness ($2\pi\cdot H/\lambda_M$) and mode have high phase velocities of 5500 m/s or more and high electromechanical coupling coefficients of 0.5% or more, and can operate at higher frequencies in comparison with conventional materials, such as quarts crystal, $LiNbO_3$, etc.

Embodiment 2

Surface acoustic wave filters, structured as shown in FIG. 1 and having three kinds of double electrodes with different film thickness, were produced while the thickness of the ZnO was changed. The electrode segments of the electrode were formed so that the width of each electrode segment and the clearance between the electrode segments were 1 μm. The value 8 times the electrode segment width dm+electrode interval df, that is, 8×(dm+df), is defined as a basic value. Electrode patterns were formed in which the distances between the centers of the electrode segments of the input and output electrodes in the width direction were set, respectively, to values 40, 80, and 120 times the basic value. By using a surface acoustic wave filter having these patterns, frequency characteristics of losses with respect to the fundamental wave were measured, and propagation losses were determined from the inclinations of losses. The wavelength $\lambda_M$ was 6.4 μm.

As a result, as shown in FIG. 10, the propagation loss decreases, as the ZnO film is thicker. In comparison with the case where the thickness $2\pi \cdot H/\lambda_M$ of the ZnO is 1, the setting of the film thickness for this time can reduce the propagation loss from 71 dB/cm to 66 dB/cm. Hence, the propagation loss clearly is reduced in comparison with the case of the conventional film thickness.

INDUSTRIAL APPLICABILITY

According to the present invention, it is possible to obtain a surface acoustic wave device having a small propagation loss, a large propagation velocity and a large electromechanical coupling coefficient. It is thus possible to easily provide a surface acoustic wave device operating in the high frequency range of several hundreds of MHz to several tens of GHz. The surface acoustic wave device can be used for band-pass filters, resonators, oscillators and convolvers.

The invention claimed is:

1. A surface acoustic wave device having a structure wherein a ZnO layer is stacked on a dielectric thin film comprising a diamond layer or a diamond layer formed on a substrate, and interdigital transducers for exciting a surface acoustic wave are disposed on said ZnO layer, being characterized by the use of a second order mode surface acoustic wave excited by a structure wherein the value of $2\pi \cdot H/\lambda_M$ satisfies $(2\pi \cdot H/\lambda_M)$=5.0 to 6.0 where the thickness of said ZnO layer is H and the wavelength of the surface acoustic wave is $\lambda_M$.

2. A surface acoustic wave device having a structure wherein a ZnO layer is stacked on a dielectric thin film comprising a diamond layer or a diamond layer formed on a substrate, and interdigital transducers for exciting a surface acoustic wave are disposed on said ZnO layer, being characterized by the use of a third order mode surface acoustic wave excited by a structure wherein the value of $2\pi \cdot H/\lambda_M$ satisfies $(2\pi \cdot H/\lambda_M)$=6.0 to 8.5 where the thickness of said ZnO layer is H and the wavelength of the surface acoustic wave is $\lambda_M$.

3. A surface acoustic wave device having a structure wherein a ZnO layer is stacked on a dielectric thin film comprising a diamond layer or a diamond layer formed on a substrate, and interdigital transducers for exciting a surface acoustic wave are disposed on said ZnO layer, being characterized by the use of a fourth order mode surface acoustic wave excited by a structure wherein the value of $2\pi \cdot H/\lambda_M$ satisfies $(2\pi \cdot H/\lambda_M)$=9.0 to 10.0 where the thickness of said ZnO layer is H and the wavelength of the surface acoustic wave is $\lambda_M$.

4. A surface acoustic wave device having a structure wherein interdigital transducers for exciting a surface acoustic wave are disposed on a dielectric thin film comprising a diamond layer or a diamond layer formed on a substrate, and a ZnO layer is stacked on said interdigital transducers, being characterized by the use of a fifth order mode surface acoustic wave excited by a structure wherein the value of $2\pi \cdot H/\lambda_M$ satisfies $(2\pi \cdot H/\lambda_M)$=7.7 to 9.5 where the thickness of said ZnO layer is H and the wavelength of the surface acoustic wave is $\lambda_M$.

5. A surface acoustic wave device having a structure wherein interdigital transducers for exciting a surface acoustic wave are disposed on a dielectric thin film comprising a diamond layer or a diamond layer formed on a substrate, a ZnO layer is stacked on said interdigital transducers, and a short-circuit electrode is disposed on said ZnO layer, being characterized by the use of the second order mode surface acoustic wave excited by a structure wherein the value of $2\pi \cdot H/\lambda_M$ satisfies $(2\pi \cdot H/\lambda_M)$=7.2 to 8.5 where the thickness of said ZnO layer is H and the wavelength of the surface acoustic wave is $\lambda_M$.

6. A surface acoustic wave device having a structure wherein interdigital transducers for exciting a surface acoustic wave are disposed on a dielectric thin film comprising a diamond layer or a diamond layer formed on a substrate, a ZnO layer is stacked on said interdigital transducers, and a short-circuit electrode is disposed on said ZnO layer, being characterized by the use of the fifth order mode surface acoustic wave excited by a structure wherein the value of $2\pi \cdot H/\lambda_M$ satisfies $(2\pi \cdot H/\lambda_M)$=7.8 to 9.5 where the thickness of said ZnO layer is H and the wavelength of the surface acoustic wave is $\lambda_M$.

7. A surface acoustic wave device having a structure wherein a short-circuit electrode is stacked on a dielectric thin film comprising a diamond layer or a diamond layer formed on a substrate, a ZnO layer is stacked on said short-circuit electrode, and interdigital transducers for exciting a surface acoustic wave are disposed on said ZnO layer, being characterized by the use of the second order mode surface acoustic wave excited by a structure wherein the value of $2\pi \cdot H/\lambda_M$ satisfies $(2\pi \cdot H/\lambda_M)$=4.8 to 6.0 where the thickness of said ZnO layer is H and the wavelength of the surface acoustic wave is $\lambda_M$.

8. A surface acoustic wave device having a structure wherein a short-circuit electrode is stacked on a dielectric thin film comprising a diamond layer or a diamond layer formed on a substrate, a ZnO layer is stacked on said short-circuit electrode, and interdigital transducers for exciting a surface acoustic wave are disposed on said ZnO layer, being characterized by the use of the third order mode surface acoustic wave excited by a structure wherein the value of $2\pi \cdot H/\lambda_M$ satisfies $(2\pi \cdot H/\lambda_M)$=6.0 to 8.5 where the thickness of said ZnO layer is H and the wavelength of the surface acoustic wave is $\lambda_M$.

9. A surface acoustic wave device having a structure wherein a short-circuit electrode is stacked on a dielectric thin film comprising a diamond layer or a diamond layer formed on a substrate, a ZnO layer is stacked on said short-circuit electrode, and interdigital transducers for exciting a surface acoustic wave are disposed on said ZnO layer, being characterized by the use of the fourth order mode surface acoustic wave excited by a structure wherein the value of $2\pi \cdot H/\lambda_M$ satisfies $(2\pi \cdot H/\lambda_M)=9.0$ to 10.0 where the thickness of said ZnO layer is H and the wavelength of the surface acoustic wave is $\lambda_M$.

10. A surface acoustic wave device in accordance with any one of claims 1 through 9, wherein the surface acoustic wave to be used is a fundamental wave.

11. A surface acoustic wave device in accordance with any one of claims 1 through 9, wherein the surface acoustic wave to be used is a harmonic wave.

* * * * *